(12) United States Patent
Anderson et al.

(10) Patent No.: US 11,374,646 B2
(45) Date of Patent: Jun. 28, 2022

(54) SYSTEMS AND DEVICES FOR WIRELESS COMMUNICATION THROUGH AN ELECTROMAGNETICALLY SHIELDED WINDOW

(71) Applicant: INNOVERE MEDICAL INC., Markham (CA)

(72) Inventors: Kevan James Thompson Anderson, Oshawa (CA); Donald Bruce Plewes, Toronto (CA); Garry Ka Chun Liu, Etobicoke (CA); Lynsie Alexandra Marie Thomason, Toronto (CA)

(73) Assignee: INNOVERE MEDICAL INC., Markham (CA)

( * ) Notice: Subject to any disclaimer, the term of this patent is extended or adjusted under 35 U.S.C. 154(b) by 330 days.

(21) Appl. No.: 16/611,657

(22) PCT Filed: May 9, 2018

(86) PCT No.: PCT/CA2018/050557
§ 371 (c)(1),
(2) Date: Nov. 7, 2019

(87) PCT Pub. No.: WO2018/205031
PCT Pub. Date: Nov. 15, 2018

(65) Prior Publication Data
US 2020/0169315 A1 May 28, 2020

Related U.S. Application Data

(60) Provisional application No. 62/567,063, filed on Oct. 2, 2017, provisional application No. 62/503,552, filed on May 9, 2017.

(51) Int. Cl.
*H04B 7/14* (2006.01)
*H04B 7/145* (2006.01)
(Continued)

(52) U.S. Cl.
CPC .......... *H04B 7/145* (2013.01); *G01R 33/3692* (2013.01); *G01R 33/422* (2013.01)

(58) Field of Classification Search
CPC .... H04B 7/145; H04B 5/0031; H04B 5/0087; G01R 33/3692; G01R 33/422;
(Continued)

(56) References Cited

U.S. PATENT DOCUMENTS

| 4,885,538 A | 12/1989 | Hoenniger, III et al. |
| 5,172,085 A | 12/1992 | Glenat |

(Continued)

FOREIGN PATENT DOCUMENTS

| WO | 0064335 | 11/2000 |
| WO | 2007132396 | 11/2007 |

(Continued)

OTHER PUBLICATIONS

Leung et al., Proc. of the International Society for Magnetic Resonance in Medicine, Toronto, Canada, 16, 1141 (2008).
(Continued)

*Primary Examiner* — Shaima Q Aminzay
(74) *Attorney, Agent, or Firm* — Hill & Schumacher

(57) ABSTRACT

Systems and devices are provided in which an RF wireless bridge is employed to facilitate indirect transmission of communication signals between external devices located outside of an electromagnetically shielding enclosure within internal devices located within the enclosure, via the intermediate transmission of RF waves through an RF attenuating window forming a portion of the enclosure. The wireless bridge is formed from a first RF communication device located within the electromagnetically shielding enclosure, and a second RF communication device located outside of the enclosure, where the two RF communication devices are positioned with sufficient proximity such that the wireless
(Continued)

bridge facilitates indirect communication through the RF attenuating window despite attenuation of RF energy by the RF attenuating window. In another example embodiment, the electromagnetically shielding enclosure may enclose at least a portion of the first RF communication device to reduce noise that could impact the performance of the magnetic resonance scanner.

40 Claims, 12 Drawing Sheets

(51) Int. Cl.
G01R 33/36 (2006.01)
G01R 33/422 (2006.01)

(58) Field of Classification Search
CPC ............ G01R 33/283; G01R 33/34046; G01R 33/3621; G01R 33/3635; G01R 33/567; G01R 33/5673; H04W 92/20; H01Q 1/526
USPC .......................................................... 455/15
See application file for complete search history.

(56) References Cited

U.S. PATENT DOCUMENTS

| | | | |
|---|---|---|---|
| 5,494,036 A | 2/1996 | Uber, III et al. | |
| 5,552,708 A | 9/1996 | Ham | |
| RE36,648 E | 4/2000 | Uber, III et al. | |
| 6,269,247 B1 | 7/2001 | Chiodini | |
| RE37,602 E | 3/2002 | Uber, III et al. | |
| 6,463,316 B1 | 10/2002 | Brungart | |
| 6,535,084 B1 | 3/2003 | Tropp | |
| 6,704,592 B1 * | 3/2004 | Reynolds ............. | G01R 33/283 324/322 |
| 7,221,159 B2 | 5/2007 | Griffiths et al. | |
| 7,283,860 B2 | 10/2007 | Frazier et al. | |
| 7,292,704 B2 | 11/2007 | Lederer | |
| 7,443,165 B2 | 10/2008 | Varjo | |
| 7,606,592 B2 | 10/2009 | Becker | |
| 7,898,356 B2 | 3/2011 | Sherrer | |
| 8,214,012 B2 | 7/2012 | Zuccolotto et al. | |
| 8,344,829 B2 | 1/2013 | Miller, II | |
| 8,929,995 B2 | 1/2015 | Stancer et al. | |
| 9,065,163 B1 | 6/2015 | Wu | |
| 9,244,139 B2 | 1/2016 | Brown et al. | |
| 9,306,656 B2 | 4/2016 | Ong | |
| 9,331,886 B2 | 5/2016 | Harwell et al. | |
| 9,504,429 B1 | 11/2016 | Minkoff | |
| 9,660,336 B2 | 5/2017 | Anderson et al. | |
| 9,753,671 B2 | 9/2017 | Martin et al. | |
| 10,374,657 B2 | 8/2019 | Britz et al. | |
| 2002/0133071 A1 | 9/2002 | Wolff et al. | |
| 2003/0050555 A1 | 3/2003 | Critchlow et al. | |
| 2003/0058502 A1 | 3/2003 | Griffiths et al. | |
| 2004/0082309 A1 | 4/2004 | Smith | |
| 2005/0107681 A1 | 5/2005 | Griffiths | |
| 2005/0197565 A1 | 9/2005 | Yagi et al. | |
| 2006/0206024 A1 | 9/2006 | Weeks, Jr. et al. | |
| 2006/0287593 A1 | 12/2006 | Jaggu et al. | |
| 2011/0124301 A1 | 5/2011 | Prasidh et al. | |
| 2011/0237932 A1 | 9/2011 | Staats et al. | |
| 2012/0143040 A1 | 6/2012 | Goswami et al. | |
| 2012/0165634 A1 | 6/2012 | Lee et al. | |
| 2012/0215092 A1 | 8/2012 | Harris, III et al. | |
| 2012/0316428 A1 | 12/2012 | Guttler et al. | |
| 2013/0182085 A1 | 7/2013 | Ziarati | |
| 2013/0201651 A1 | 8/2013 | Schnekenburger et al. | |
| 2014/0354279 A1 | 12/2014 | Dumoulin | |
| 2015/0372378 A1 | 12/2015 | Anderson et al. | |
| 2019/0377042 A1 | 12/2019 | Anderson et al. | |

FOREIGN PATENT DOCUMENTS

| | | |
|---|---|---|
| WO | 2011072667 | 6/2011 |
| WO | 2012154961 | 11/2012 |
| WO | 2014121402 | 8/2014 |
| WO | 2015158597 | 10/2015 |

OTHER PUBLICATIONS

International Search Report in PCT/CA2014/050086, dated Jul. 11, 2014.
International Search Report in PCT/CA2016/051417, dated Jan. 25, 2017.
Bender, J., et al., Proc. Intl. Soc. Mag. Reson. Med. 18, 3931 (2010).
International Search Report in PCT/CA2018/050557 dated Jul. 30, 2018.

* cited by examiner

FIG. 13C
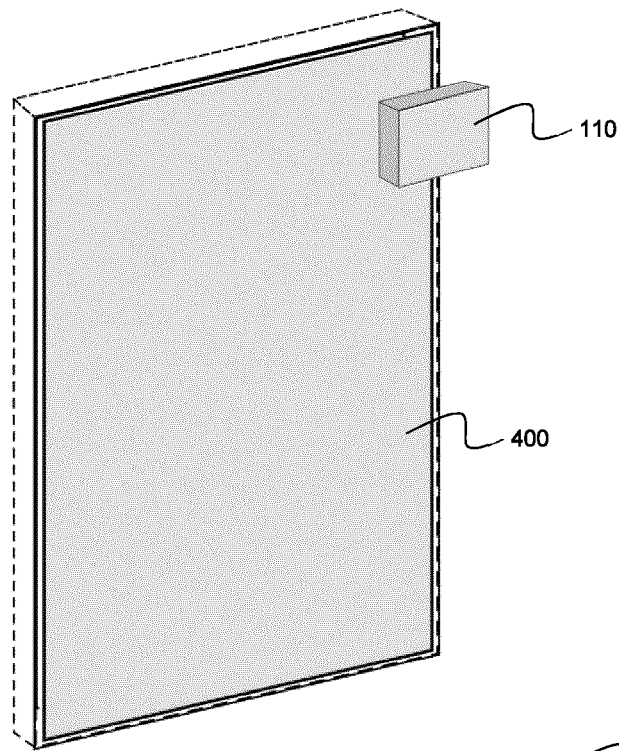
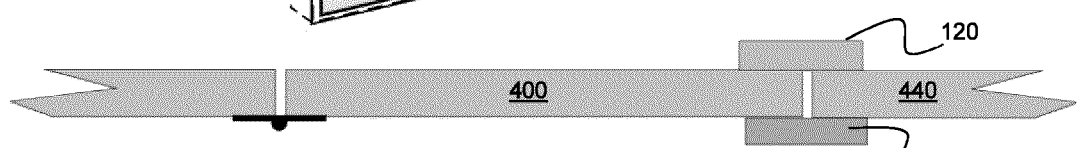
FIG. 13D
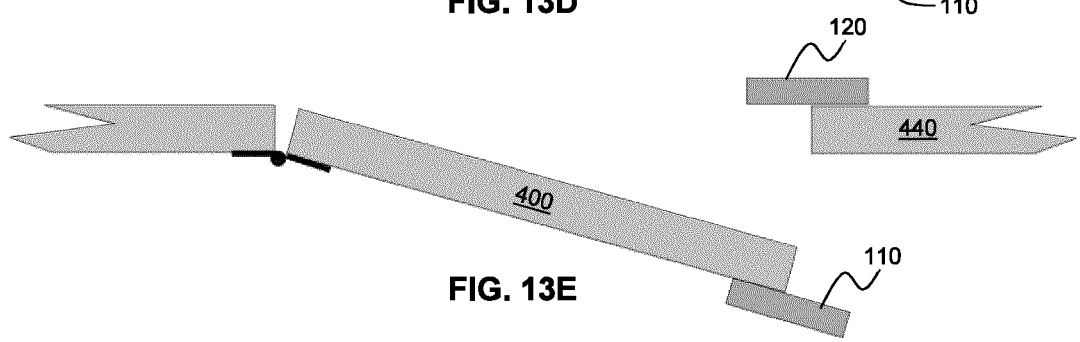
FIG. 13E

SYSTEMS AND DEVICES FOR WIRELESS COMMUNICATION THROUGH AN ELECTROMAGNETICALLY SHIELDED WINDOW

CROSS-REFERENCE TO RELATED APPLICATION

This application is a National Phase application claiming the benefit of the international PCT Patent Application No. PCT/CA2018/050557, filed on May 9, 2018, in English, which claims priority to U.S. Provisional Application No. 62/503,552, titled "SYSTEMS AND DEVICES FOR WIRELESS COMMUNICATION THROUGH AN ELECTROMAGNETICALLY SHIELDED WINDOW" and filed on May 9, 2017, the entire contents of which are incorporated herein by reference, and to U.S. Provisional Application No. 62/567,063, titled "SYSTEMS AND DEVICES FOR WIRELESS COMMUNICATION THROUGH AN ELECTROMAGNETICALLY SHIELDED WINDOW" and filed on Oct. 2, 2017, the entire contents of which is incorporated herein by reference.

BACKGROUND

The present disclosure relates to electromagnetically shielded environments and communications through electromagnetically shielded enclosures. More particularly, the present disclosure relates to the use of wireless devices with magnetic resonance imaging systems.

Magnetic resonance (MR) imaging systems are installed inside an electromagnetically shielded room. The purpose of the shielding (also known as a Faraday cage) is to block any electromagnetic energy within the operating bandwidth of the MR scanner (typically 64 MHz+/−250 kHz for a 1.5 T system and 128 MHz+/−250 kHz for a 3 T system) from entering the scanning room. This eliminates outside interference with the scanner and preserves image quality.

It is often desirable to use wireless peripheral devices inside the shielded scanning room in and around the MR imaging system. Wireless devices have several benefits over wired systems in that they are less cumbersome and can be installed without any modifications to the electromagnetic shielding surround the scanning room. Such peripheral devices can include audio speakers and microphones, video displays, and patient monitoring devices. The presence of the electromagnetic shielding inhibits wireless communication between these devices and other control devices located outside the electromagnetic shield in the adjacent control room.

SUMMARY

Systems and devices are provided in which an RF wireless bridge is employed to facilitate indirect transmission of communication signals between external devices located outside of an electromagnetically shielding enclosure within internal devices located within the enclosure, via the intermediate transmission of RF waves through an RF attenuating window forming a portion of the enclosure. The wireless bridge is formed from a first RF communication device located within the electromagnetically shielding enclosure, and a second RF communication device located outside of the enclosure, where the two RF communication devices are positioned with sufficient proximity such that the wireless bridge facilitates indirect communication through the RF attenuating window despite attenuation of RF energy by the RF attenuating window. In another example embodiment, the electromagnetically shielding enclosure may enclose at least a portion of the first RF communication device to reduce noise that could impact the performance of the magnetic resonance scanner.

Accordingly, in a first aspect, there is provided a magnetic resonant imaging and communication system comprising:

a magnetic resonance scanner having an operating frequency range;

an electromagnetically shielded enclosure defining a scanner room, the scanner room containing said magnetic resonance scanner;

said electromagnetically shielded enclosure comprising an RF attenuating window having an internal window surface facing inside the scanner room and an external window surface facing outside the scanner room; and a wireless bridge for relaying wireless signals across said RF attenuating window, said wireless bridge comprising:
  a first RF communication device located inside the scanner room, said first RF communication device comprising a first transceiver operably connected to a first antenna; and
  a second RF communication device located outside the scanner room, said second RF communication device comprising a second transceiver operably connected to a second antenna;

wherein said first RF communication device and said second RF communication device are configured for wireless transmission of communication signals therebetween through said RF attenuating window within a wireless bridge frequency band that lies above the operating frequency range of said magnetic resonance scanner;

wherein said first RF communication device is further configured to transmit communication signals to and receive communication signals from one or more internal devices located within the scanner room, and wherein said second RF communication device is further configured to transmit communication signals to and receive communication signals from one or more external devices located outside of the scanner room; and wherein said first RF communication device and said second RF communication device are positioned with sufficient proximity to each other such that said wireless bridge facilitates indirect communication through said RF attenuating window despite attenuation of RF energy by said RF attenuating window.

In another aspect, there is provided a wireless communication system for communication through an RF attenuating window of a scanner room of a magnetic resonance scanning system, the wireless communication system comprising:

a first RF communication device comprising a first transceiver operably connected to a first antenna;

a second RF communication device comprising a second transceiver operably connected to a second antenna;

wherein said first RF communication device and said second RF communication device are configured for wireless transmission within a wireless bridge frequency band that lies above 2 GHz, such that said first RF communication device and said second RF communication device form a wireless bridge when positioned on opposing sides of the RF attenuating window of an electromagnetically shielded enclosure that encloses the scanner room of a magnetic resonance scanner;

wherein said first RF communication device and said second RF communication device are configured such that when said first RF communication device and said second RF communication device are positioned with sufficient proximity to each other, on either side of the RF attenuating window, said first RF communication device transmits communication signals to and receives communication signals from one or more internal devices located within the scanner room, and said second RF communication device transmits communication signals to and receives communication signals from one or more external devices located outside of the scanner room, said wireless bridge facilitates indirect communication through the RF attenuating window despite attenuation of RF energy by the RF attenuating window.

In another aspect, there is provided a magnetic resonant imaging and communication system comprising:

a magnetic resonance scanner having an operating frequency range;

an electromagnetically shielded enclosure defining a scanner room, the scanner room containing said magnetic resonance scanner;

said electromagnetically shielded enclosure comprising an RF attenuating region that is attenuating, yet partially transmissive, to electromagnetic waves within an operational bandwidth of the magnetic resonance scanner; and a wireless bridge for relaying wireless signals across said RF attenuating region, said wireless bridge comprising:

a first RF communication device located inside the scanner room, said first RF communication device comprising a first transceiver operably connected to a first antenna; and a second RF communication device located outside the scanner room, said second RF communication device comprising a second transceiver operably connected to a second antenna;

wherein said first RF communication device and said second RF communication device are configured for wireless transmission of communication signals therebetween through said RF attenuating region within a wireless bridge frequency band that lies above the operating frequency range of said magnetic resonance scanner;

wherein said first RF communication device is further configured to transmit communication signals to and receive communication signals from one or more internal devices located within the scanner room, and wherein said second RF communication device is further configured to transmit communication signals to and receive communication signals from one or more external devices located outside of the scanner room; and wherein said first RF communication device and said second RF communication device are positioned with sufficient proximity to each other such that said wireless bridge facilitates indirect communication through said RF attenuating region despite attenuation of RF energy by said RF attenuating region.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

The second electromagnetically shielded enclosure is transmissive to electromagnetic waves within the additional frequency band, while attenuating electromagnetic waves generated by noise sources within the additional transceiver.

Figure 11:
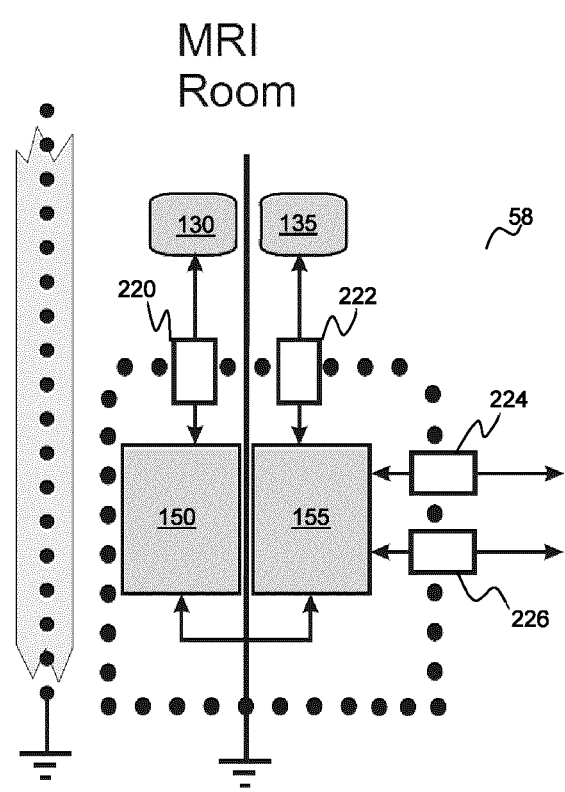

FIG. 11 shows an example wireless bridge in which the first RF communication device, located within the scanner room, includes an additional wireless transceiver and an additional antenna for communicating wirelessly with one or more internal devices located within the scanner room within an additional frequency band that lies above the operational frequency of the magnetic resonance scanner. The first RF communication device also includes a first electromagnetically shielded enclosure that encloses the first wireless transceiver and the additional wireless transceiver. The first wireless transceiver and the additional wireless transceiver are operably connected to respective antennae through ports provided within the electromagnetically shielded enclosure. The additional wireless transceiver is also optionally operably connectable to one or more internal devices (residing within the control room) through one or more additional ports provided within the electromagnetically shielded enclosure.

Figure 12A:
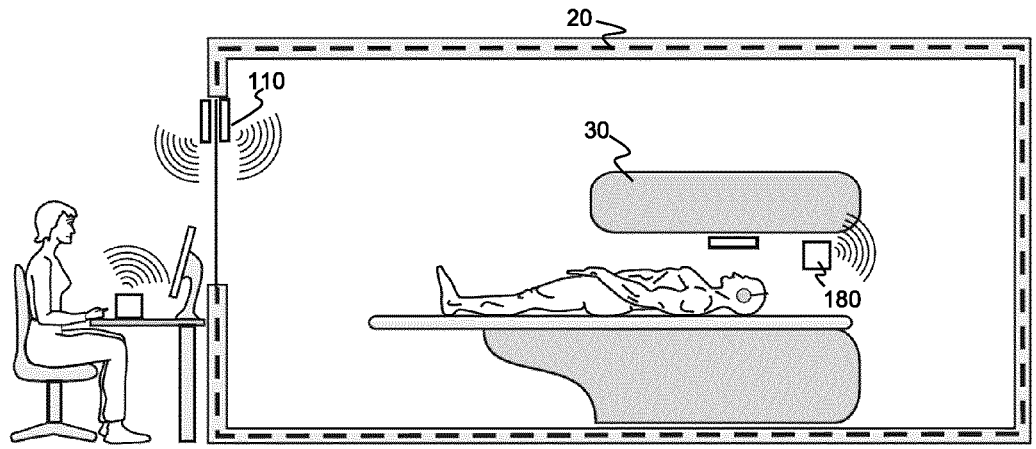

FIG. 12A shows an example embodiment in which an internal wireless device is positioned within the bore of an MR scanner, where it is susceptible to signal degradation.

Figure 12B:
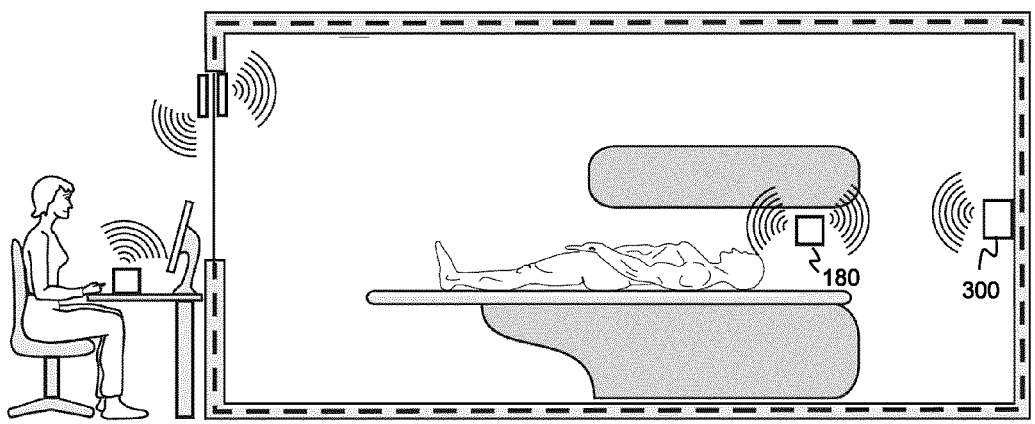

FIG. 12B shows an example embodiment in which an internal wireless device is positioned within the bore of an MR scanner, and where an intermediate wireless bridge is provided to avoid signal degradation.

Figure 12C:
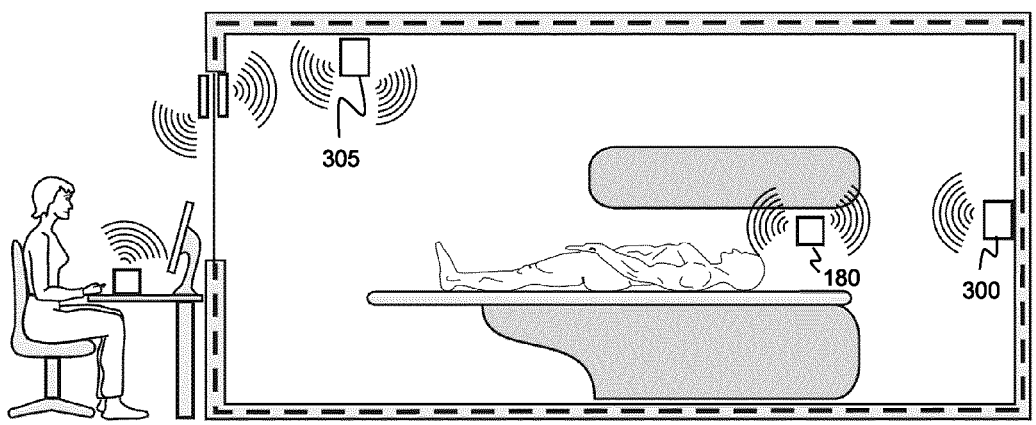

FIG. 12C shows an example embodiment in which an internal wireless device is positioned within the bore of an MR scanner, and where two intermediate wireless bridges are provided to avoid signal degradation, where the intermediate wireless bridges are positioned on opposite sides of the MR scanner bore.

Figure 12D:
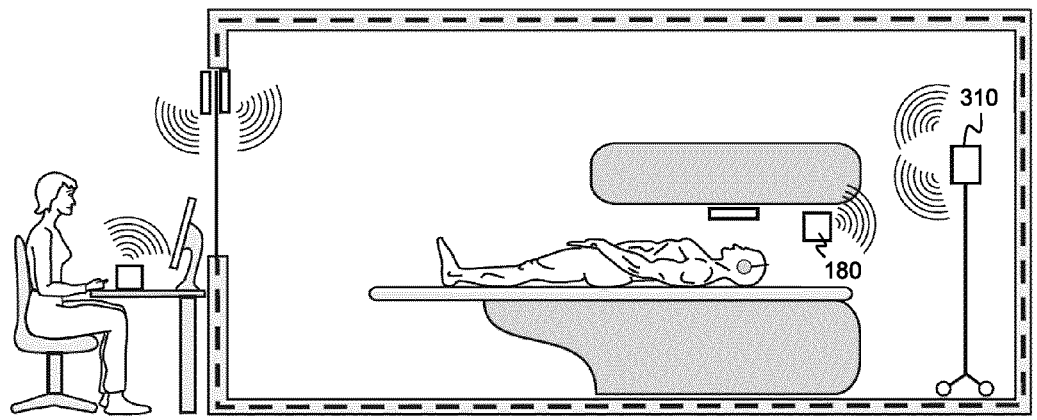

FIG. 12D shows an example embodiment in which an internal wireless device is positioned within the bore of an MR scanner, and where a movable intermediate wireless bridge is provided to avoid signal degradation.

Figure 12E:
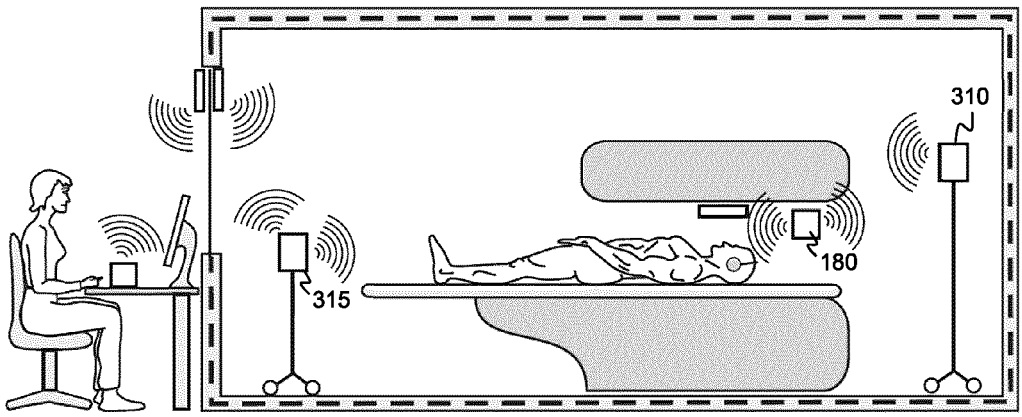

FIG. 12E shows an example embodiment in which an internal wireless device is positioned within the bore of an MR scanner, and where two movable intermediate wireless bridges are provided to avoid signal degradation.

Figure 13A:
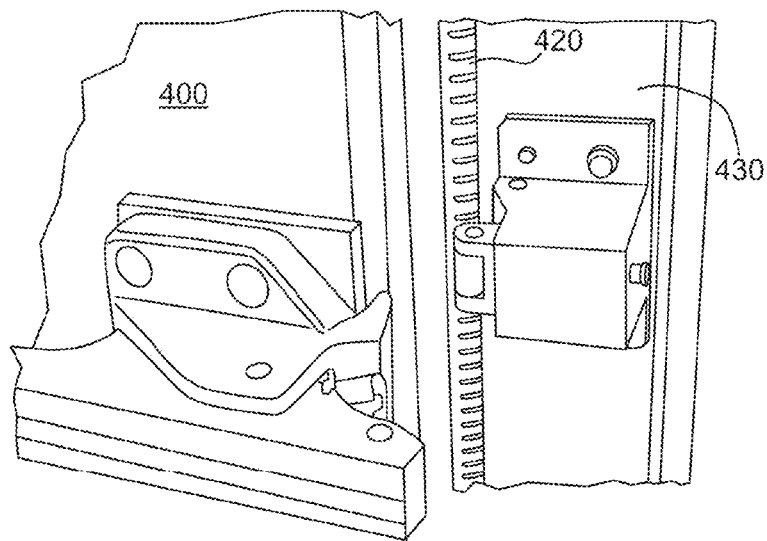
Figure 13B:
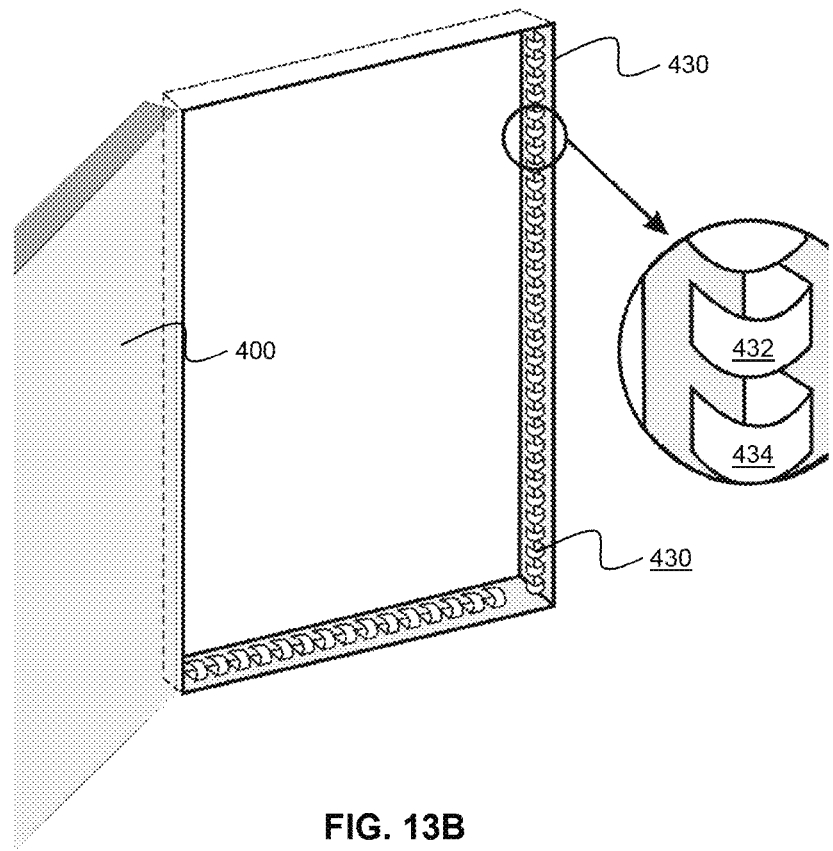

FIGS. 13A and 13B show an example of a door frame of an electromagnetically shielding enclosure, where the door frame includes electrically conductive fingers to facilitate electromagnetic shielding.

FIGS. 13C-13E illustrate an example embodiment in which a wireless bridge is employed to facilitate indirect RF wireless transmission across an RF attenuating region associated with the electrically conductive fingers of a door frame.

Figures 13F, 13G:
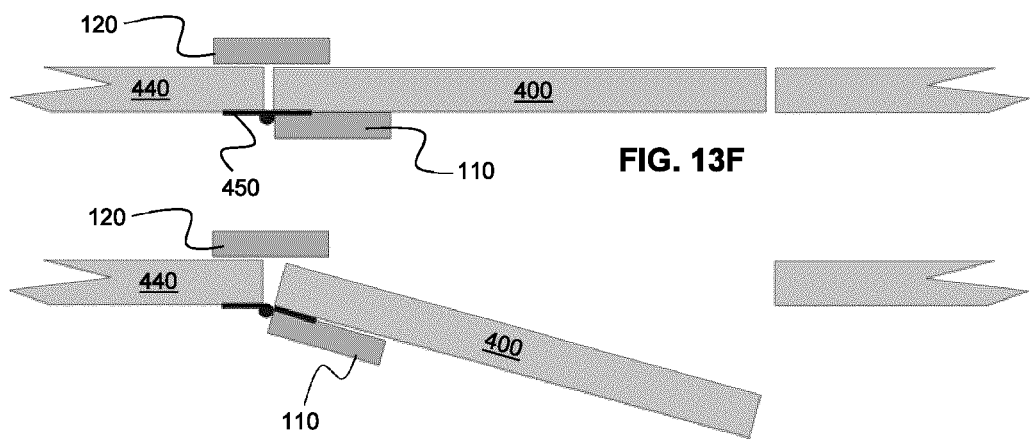

FIGS. 13F and 13G illustrate an alternative example embodiment in which a wireless bridge is employed to facilitate indirect RF wireless transmission across an RF attenuating region associated with the electrically conductive fingers, in which the wireless bridge is mounted on a hinge-side of the door.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean plus or minus 25 percent or less.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

As used herein, the phrase "RF communication device" refers to a wireless device, capable of transmitting and/or receiving radio-frequency (RF) waves, for use in the wireless transmission and reception of at least audio signals, at least video signals, or at least a combination of audio and video signals. An "RF communication device", as used herein, may also be capable of transmitting other data in addition audio and/or video signals. An "RF communication signal" and variations thereof means a wireless signal encoded with at least audio signals, at least video signals, or at least a combination of audio and video signals. An "RF communication signal", as used herein, may also be encoded with other data in addition audio and/or video signals.

Figure 1:
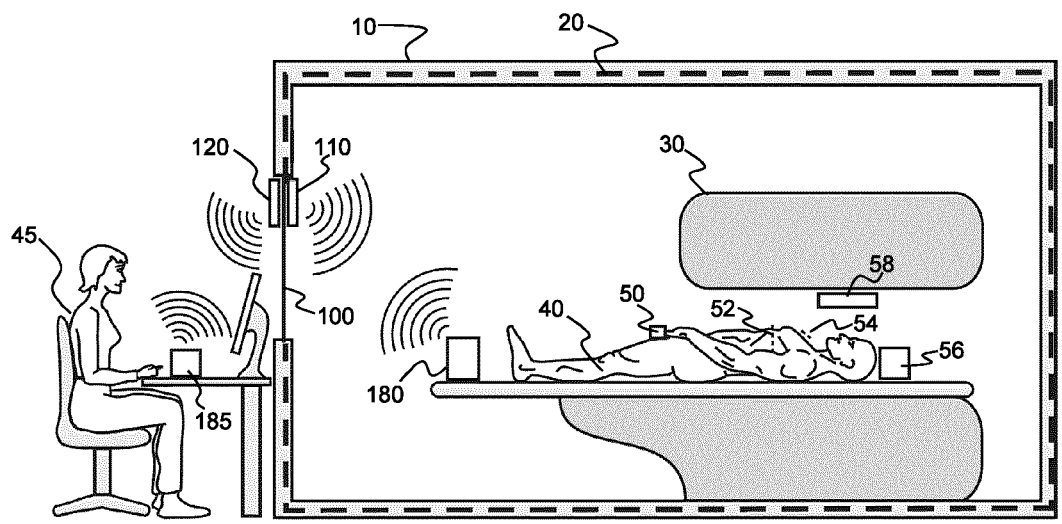
FIG. 1 shows an example magnetic resonant imaging and communication system in which a wireless bridge is configured for wireless transmission through an RF attenuating window of the electromagnetically shielding enclosure.

Various embodiments of the present disclosure provide devices and systems that facilitate wireless communication across an electromagnetically shielding enclosure through an RF attenuating window via the use of a RF wireless bridge. With reference to FIG. 1, a magnetic resonance (MR) imaging and communication system is illustrated, in which communication across an RF attenuating window is facilitated by a RF wireless bridge. As shown in the figure, a MR scanner 30 is situated in the scanner room 10 which is surrounded by an electromagnetically shielding enclosure (Faraday cage) 20. The electromagnetically shielding enclosure may be formed from conducting material (for example, in solid or mesh form, or a combination thereof, such as thin copper or aluminum interconnected sheets). Such an enclosure attenuates RF signals and prevents them from entering the scanner room 10. External equipment, such as a computer for controlling the MR scanner 30, may be located in a control room that is external to the scanner room 10 and operated by an external user 45.

The electromagnetically shielding enclosure 20 includes an RF attenuating window 100 incorporating a conductive material (for example, a conductive coating or a conductive mesh). The RF attenuating window may include, for example, a single or double glass structure that contains an electrically conductive material (e.g. mesh) that is electrically connected and grounded to the Faraday cage of the scanner room to ensure the integrity of the electromagnetically shielded enclosure. The conductive material provides shielding against electromagnetic waves within the operating bandwidth of the MR scanner 30, thereby maintaining the continuity and functionality of the electromagnetically shielding enclosure (Faraday cage) surrounding the scanner room 10 while permitting users to see inside of, and outside of, the scanner room 10.

The RF attenuating window 100 typically attenuates electromagnetic waves by approximately 100 dB within the operational bandwidth of the MR scanner 30. However, the RF attenuating window 100 also provides significant attenuation of propagating RF waves above the maximum operating frequency of the MR scanner 30. This RF attenuation of the window is significantly dependent on frequency for frequencies with the 1-10 GHz range. For example, a double copper mesh of fine wires at a spacing of 3.8 mm exhibits a 20 dB reduction in attenuation between 400 MHz and 1 GHz for a 10-fold reduction in attenuation. Bradley cites similar experiments and theory which demonstrates a 25 dB attenuation reduction at 2.4 GHz compared to 100 MHz with a screen composed of 0.06 mm diameter bronze wire woven into a rectangular mesh having a spacing of 1.41×1.81 mm (Richard Bradley: A Low Cost Screen Enclosure for Effective Control of Undesired Radio Frequency Emissions, Laboratory Report NRAO Electronics Division Internal Report Series, Report No 317, Jul. 17, 2006). Furthermore, the wire meshes embedded in glass that are conventionally used for electromagnetic shielding of a MR scanner typically provide attenuation in the range of 60-90 dB at 1 GHz and 30-60 dB at 10 GHz, depending on the mesh configuration, while still allowing transmission in the visible range of 40-70%.

This high-frequency attenuation of the RF attenuating window hampers efforts to form direct wireless links between devices inside and outside the scanner room 10. For example, the present inventors have found, during experimentation, that a conventional RF attenuating window causes significant attenuation of signals at 2.4 GHz when attempting to establish direct Bluetooth connections between an internal wireless device with 25 mW output power located within the scanner room 10 and an external wireless device with 25 mW output power located outside of the scanner room 10. Indeed, during experimentation in establishing such a wireless connection, it was found that the two wireless devices needed to be located within approximately one meter of each other, on opposite sides of the window, adjacent to each window surface, in order to achieve a direct wireless connection with a sufficient signal-to-noise ratio to transmit an audio signal without significant distortion. This finding was in stark contrast to, and in apparent conflict with, the teachings of U.S. Pat. No. 9,504,429 (Minkoff et al.), in which it is stated that such direct wireless connections can be achieved across an RF attenuating window of an electromagnetically shielded enclosure, without describing or providing any restrictions on the relative proximity of the two wireless devices.

It is believed that the apparent conflict between the teachings of the Minkoff patent and the experimental observations of the present inventors is due to the nature of the transmitted data. Indeed, Minkoff et al. teaches the use of a direct wireless link, established through the RF attenuating window of an electromagnetically shielding enclosure, may be operable for the transmission of data from a physiological sensor through the window to an external computer in the control room. Specifically, Minkoff et al. teaches that the physiological sensor may be "a photoplethysmograph, oxymeter, an EKG sensor, or any sensor that detects heartbeat, respiration, blood pulse, or another physiological parameter suitable for use in gating MRI systems". Each of these sensors are low-bandwidth sensors that would be capable of data transmission through a 2.4 GHz wireless channel even in the presence of high loss, especially given the significant extraneous bandwidth available in a conventional wireless channel at this frequency for the use of forward error correction to improve signal robustness.

However, in contrast to the narrow teachings of Minkoff et al., which are limited in scope to the wireless transmission of low bandwidth sensor data, the present inventors set out to identify technical solutions that would facilitate the transmission of communication data including, at least, real-time audio and/or video data, with the ability to use relatively low-power transceivers (e.g. transceivers that operate in the 2.4 Gz regime with output power less than or equal to 100 mW). The higher bandwidth demands of such communication signals are significantly more susceptible to transmission loss due to attenuation and propagation. After experimentally observing that a higher-bandwidth communication signal, when implemented as a direct wireless connection as per the teachings of Minkoff et al., resulted in unacceptable signal distortion and loss of quality, the inventors developed a wireless communication system in which a wireless bridge is employed to facilitate the indirect transmission of communication signals between internal and external devices. In contrast to the challenges faced when attempting to form a direct wireless link through the window, the inventors found that the RF wireless bridge provided the flexibility to position the two RF wireless communication devices that form the wireless bridge with sufficient proximity to achieve a required signal-to-noise ratio or signal quality, while at the same time allowing the internal and external devices to be freely positioned.

A wireless bridge provides a number of potential advantages and benefits over direct wireless links known in the art. As noted above, one advantage of a wireless bridge is the decoupling of the positional sensitivity of the system from the internal and external devices, and the shifting of this positional sensitivity onto the RF communication devices of the RF wireless bridge. This allows the two RF communication devices forming the wireless bridge to be positioned as close as necessary to each other (and, for example, as close as necessary to the RF attenuating window), while allowing the internal and external devices to be freely positioned without concern on the effect on transmitted signal quality. For example, in the case of audio transmission at 2.4 GHz, in which the loss through the RF attenuating window is likely to be in the range of 50-80 dB, the close positioning of the two RF communication devices (e.g. with a relative spacing of less than approximately 100 cm) enables the establishment of an indirect transmission link from an external device outside of the scanner room, through the wireless bridge, to an internal device within the scanner room, with a sufficiently high audio signal quality, and all the while permitting the free movement of the internal and external devices without concern over signal quality.

Another significant benefit of the use of a wireless bridge is the ability to employ different transceiver and/or antenna properties than those used for communication with the internal and external devices. For example, the transceivers and/or antennae used to communicate over the wireless bridge, through the RF attenuating window, may be configured for RF transmission at different frequencies and/or different powers than those used to communicate with the internal and external devices. In another example, the antennae used to communicate over the wireless bridge, through the RF attenuating window, may be configured for directional RF transmission, as described in further detail below, in order to minimize transmission loss while the antennas used to communicate between the communication devices and the internal and external devices may be configured for omnidirectional communication to enable flexibility in their positioning. Furthermore, unlike prior art implementations that required line-of-sight optical or infrared transmission, the wireless bridge implementations of the present disclosure afford greater positional tolerance of the two RF bridge devices, while still facilitating transmission through the RF attenuating window.

In the example embodiment shown in FIG. 1, an RF wireless bridge is implemented by the first RF communication device 110 and the second RF communication device 120, which are configured for wireless transmission therebetween, through the RF attenuating window 100, within a wireless bridge frequency band that lies above the operating frequency range of the magnetic resonance scanner 30. The first RF communication device 110, located within the scanner room 10, communicates with internal devices, either using wireless connections, as shown in FIG. 1, or using wired connections, or a combination thereof. The second RF communication device 120, located outside of the scanner room 10, communicates with external devices, either using wireless connections, as shown in FIG. 1, or using wired connections, or a combination thereof.

In the example embodiment shown in FIG. 1, the first RF communication device 110 is shown transmitting and/or receiving wireless signals from an internal wireless device 180. The internal wireless device 180 is connected, through wired connections (that are optionally multiplexed), to a plurality of additional devices, which, as shown in the figure, may include, but are not limited to, blood saturation cuff 50, respiratory bellows 52, ECG electrodes 54, speaker and/or microphone 56, and display screen 58. The second RF communication device 120 is shown transmitting and/or receiving wireless signals from an external wireless device 185, which may be a computer such as a control console for controlling and/or monitoring the MR scanner 30.

As shown in FIG. 1, by employ an RF wireless bridge to facilitate transmission through the RF attenuating window, it is possible to position the two RF communication devices of the RF wireless bridge in a proximal relationship in order to achieve a desired level of signal quality, while permitting the internal devices to be located anywhere within the range of the first RF communication device, and the external devices to be located anywhere within the range of the second RF wireless communication device.

The first RF communication device and the second RF communication device forming the RF wireless bridge may be positioned with a proximity that is sufficient to establish a sufficient signal-to-noise ratio, signal clarity, lack of distortion, or other suitable measure of transmission quality. It will be understood that the proximity of first RF communication device and the second RF communication device will vary depending on a number of implementation specific factors. For example, the proximity required to achieve a sufficient transmission quality will depend on the frequency of the RF wireless bridge, as the attenuation caused by the RF attenuating window is frequency-dependent and generally reduces with frequency about 1 GHz. For example, while a Bluetooth wireless audio link employing a transmitted power of 24 dBm at a frequency of 2.4 GHz may require a proximity of less than approximately 1 m, the same audio link operating at a frequency of 5 GHz may permit a greater separation due to the decreased attenuation of the RF attenuating window at this higher frequency. The proximity will also be dependent on the signal bandwidth relative to the available channel bandwidth, the transmitted power, and the sensitivity of the antennae. For example, an increase in the signal bandwidth may result in a reduced permissible separation, and an increase in transmitted power or antenna sensitivity will result in an increased permissible separation.

The skilled artisan may determine a suitable proximity of first RF communication device and the second RF communication device by varying the relative separation of the first RF communication device and the second RF communication device and monitoring the quality of the transmitted signal. For example, first RF communication device and the second RF communication device may be initially placed immediately adjacent to respective sides of the RF attenuating window, and the separation of the devices (moving one or both of the devices) may be varied in order to determine the maximum relative proximity (or a range separation) that still delivers a sufficient transmitted signal quality (e.g. an audio or video signal with a sufficiently low level of distortion). In another example method, first RF communication device and the second RF communication device may be positioned at preferred locations, and the quality of the transmitted signal may be assessed. If the signal quality is insufficient, the separation of the first RF communication device and the second RF communication device may be decreased until a sufficiently high quality of the transmitted signal is achieved. The skilled artisan will also understand that it is possible to "tune" the maximum achievable proximity by varying, for example, one or more of transmitted power, antenna sensitivity, and transmitted frequency.

Although the relative proximity of the first RF communication device and the second RF wireless communication device will be implementation-specific, as described above, it will be understood that placing the first RF communication device and the second RF wireless communication devices adjacent to respective surfaces of the RF attenuating window, as shown in FIG. 1, is expected to provide a configuration that delivers optimal transmitted signal quality. In some example embodiments, the first RF communication device and the second RF wireless communication device may be placed in direct contact with the respective window surfaces. In another example embodiment, one of the first RF communication device and the second RF wireless communication device may be supported to contact the window surface, while the other device may be placed at a spatial offset relative to its respective window surface, where the spatial offset is deemed to be suitable to achieving sufficient transmitted signal quality. In another example embodiments, one of the first RF communication device and the second RF wireless communication device may be supported closer to the its respective window surface than the other device, where neither device contacts its respective window surface.

In some example embodiments, one or both of the first RF communication device and the second RF wireless communication device may each be supported such that their respective antenna reside within 50 cm, 25 cm, 10 cm, 5 cm, 2 cm, or 1 cm of their respective window surfaces. In some example embodiments, the first RF communication device and the second RF wireless communication device may be supported such that a separation of their respective antennae is less than 100 cm, less than 50 cm, less than 25 cm, less than 10 cm, or less than 5 cm.

It is further noted that unlike optical and infrared devices known in the art, the RF wireless bridge devices disclosed herein do not require a direct line-of-sight arrangement of the first RF communication device and the second RF wireless communication device. It will be understood that the effect of the alignment of the first RF communication device and the second RF wireless communication device on the maximum separation of the two devices will depend on the directivity of the antennae employed in the RF wireless bridge.

The first RF communication device and the second RF wireless communication device may be mounted according to a wide variety of supports, mechanisms and mounting hardware. For example, one or both of the RF communication devices may be directly mounted to the RF attenuating window, for example, using an adhesive (e.g. silicon rubber) or suction. In an alternative example embodiment, one or both of the RF communication devices may be supported on either side of the RF attenuating window, with or without contacting the window, via attachment to the frame surrounding the window, the wall surrounding the window, or the ceiling above the window (e.g. using an adhesive or fasteners) or on the floor. In an alternative example embodiment, one or both of the RF communication devices may be supported on either side of the RF attenuating window by a shelf, stand or platform. The RF communication devices could also be placed inside an RF transparent cabinet (such as one made of wood) placed in front or directly underneath the attenuating window. One or both of the first RF communication device and the second RF communication device may be located within panes of a multi-pane RF attenuating window.

Figure 2:
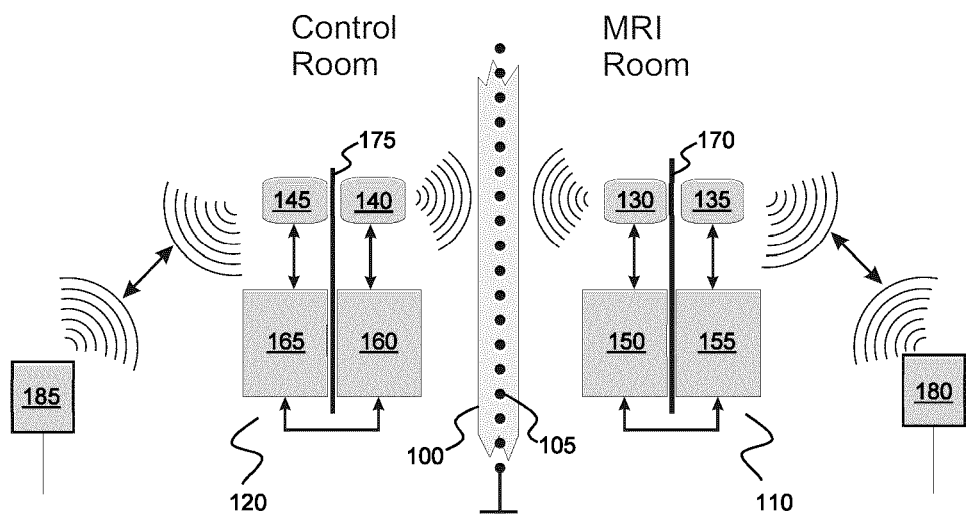
FIG. 2 shows an example wireless communication system for use with a magnetic resonance scanning system having an electromagnetically shielding enclosure enclosing a scanner room, showing an example wireless bridge configured for wireless transmission through an RF attenuating window of the electromagnetically shielding enclosure, the wireless bridge including a first RF communication device positioned adjacent to an internal window surface within the scanner room and a second RF communication device positioned adjacent to an external window surface within the scanner room. The example wireless bridge facilitates communication between internal and external devices across the electromagnetically shielding enclosure.

Referring now to FIG. 2, an example implementation of an RF wireless bridge is illustrated, where the first RF communication device 110 and the second RF communication device 120 of the RF wireless bridge are positioned on opposite sides of the RF attenuating window 100 (which contains RF attenuating mesh 105). In the example wireless bridge illustrated in the figure, both the first RF communication device 110 and the second RF communication device 120 include respective first and second transceivers 150 and 160 and respective first and second antennae 130 and 140 for wireless RF communication across the RF attenuating window 100. The first and second transceivers 150 and 160 are operably connected to respective additional transceivers 155 and 165, which are in turn operably connected to respective additional antennae 135 and 145. The additional transceivers 155, 165 and antennae 135, 145 are configured to communicate wirelessly with one or more internal devices 180 and one or more external devices 185, respectively, such that the RF wireless bridge facilitates indirect communication between internal and external devices across the electromagnetically shielding enclosure.

In some example embodiments, one or both of the first antenna 130 and the second antenna 140 may be directional antennas. For example, first antenna 130 and/or second antenna 140 may be configured to have a directivity that is maximized in the direction of the window surface, while permitting the antennas of the internal and external devices 180 and 185 to be omnidirectional.

FIG. 2 also shows an example spatial configuration of dual antennas and transceivers that may be beneficial for improving signal transmission and noise isolation, especially within the scanner room. In the illustrated embodiment, the first RF communication device 110 includes a first circuit board 170 that is arranged so that one side thereof is facing the internal window surface (the RF attenuating window surface facing into the scanner room) and the other side thereof is facing away from the internal window surface. The first antenna 130, which is employed for bridge wireless communication across the RF attenuating window 100, is supported on the side of the circuit board that faces toward the internal window surface. This configuration is beneficial in that RF waves emitted and/or received by the first antenna 130 are unimpeded by the circuit board 170 as they propagate toward and/or from the RF attenuating window 100.

Similarly, the additional antenna 135, which is employed for wireless communication with one or more internal devices 180, may be located on the side of the circuit board that faces away from the internal window surface. This configuration is beneficial in that RF waves emitted and/or received by the additional antenna 135 are unimpeded by the circuit board 170 as they propagate to and/or from the one or more internal devices 180.

As shown in FIG. 2, the first transceiver 150 may also be supported on the side of the circuit board that faces toward the inner surface of the RF attenuating window 100. This spatial arrangement causes RF noise emitted by the first transceiver 150 to be at least partially shielded by the circuit board from the MR scanner, thereby potentially reducing the effect of such noise on the performance of the MR scanner. Although the additional transceiver 155 is shown located on the side of the circuit board 170 that faces away from the internal window surface, this transceiver may alternatively be located on the side of the circuit board 170 that faces toward the internal window surface.

As shown in FIG. 2, the second RF communication device 120 may optionally also be configured in similar manner, with the second antenna 140 and optionally the second transceiver 160 located on the side of the circuit board 175 that faces toward the external window surface (the window surface facing the outside of the scanner room), and the additional antenna 145 and optionally the additional transceiver 165 may be located on the side of the circuit board 175 that faces away from the external window surface.

It will be understood that the embodiment shown in FIG. 2 is illustrative of but one example implementation of a RF wireless bridge, and that many alterative configurations are contemplated within the scope of the present disclosure.

Several non-limiting example alternative implementations are described and illustrated in the forthcoming example embodiments.

Figure 3:
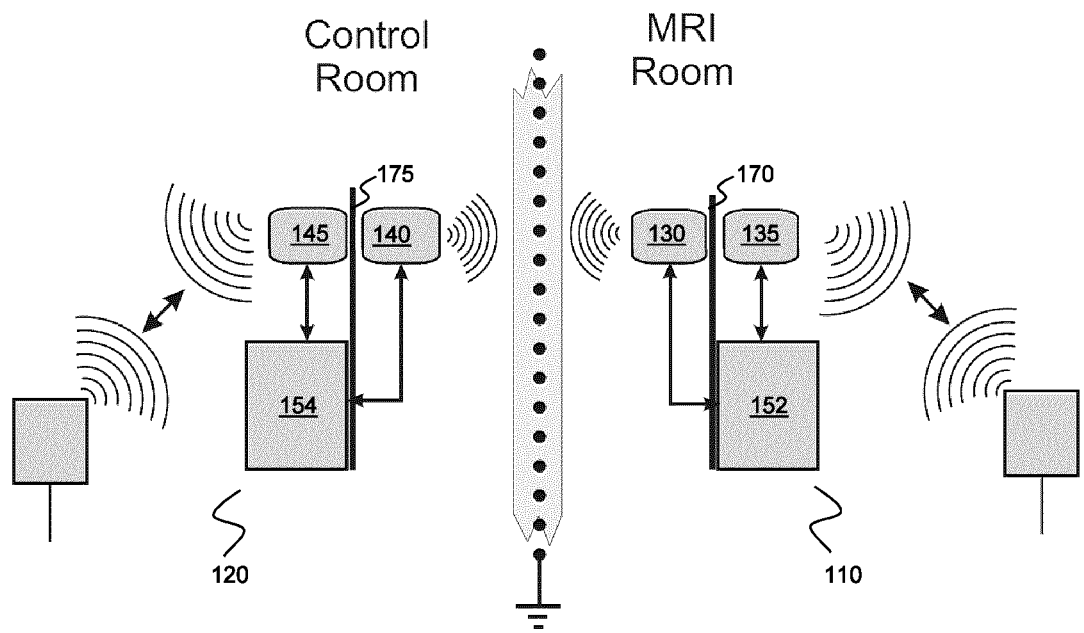
FIG. 3 shows an example wireless communication system in which the first RF communication device and the second communication device each include separate antennae for wireless transmission through the RF attenuating window and wireless transmission to (internal or external) devices. In the example embodiment shown, the two antennae are operably coupled to a single transceiver.

Referring now to FIG. 3, an example RF wireless bridge is shown in which the first and second RF communication devices 110 and 120 are provided with single respective transceivers 152 and 154. The first transceiver 152 of the first RF communication device 110 is operably connected to the first antenna 130 and the additional antenna 135. The second transceiver 154 of the second RF communication device 120 is operably connected to the second antenna 140 and the additional antenna 145. Although the figure shows the first and second transceivers 152 and 154 located on the side of their respective circuit boards 170, 175 that faces away from their respective internal and external window surfaces, the first and/or second transceivers 152, 154 may alternatively be located on the opposite side of their respective circuit boards 170, 175.

Figure 4:
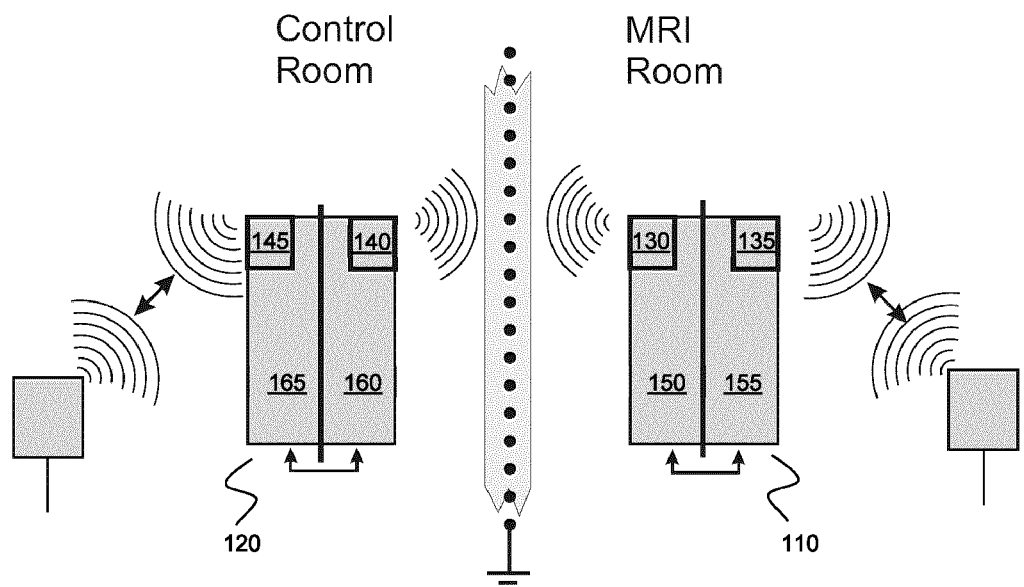
FIG. 4 shows an example wireless communication system in which the first RF communication device and the second communication device each include antennae that are respectively integrated with transceivers.

FIG. 4 shows an example wireless communication system in which the first RF communication device 110 and the second RF communication device 120 include respective antennae 130, 135, 140 and 145 that are respectively integrated with transceivers 150, 155, 160 and 165.

Figure 5:
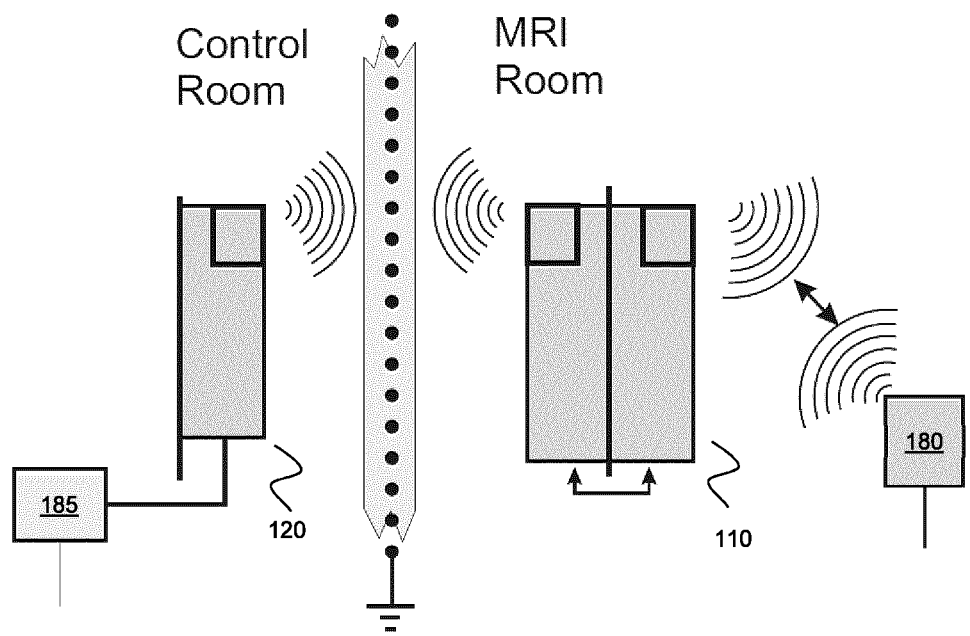
FIG. 5 shows an example wireless communication system in which the wireless bridge communicates with external devices through wired and/or wireless connections.
Figure 6:
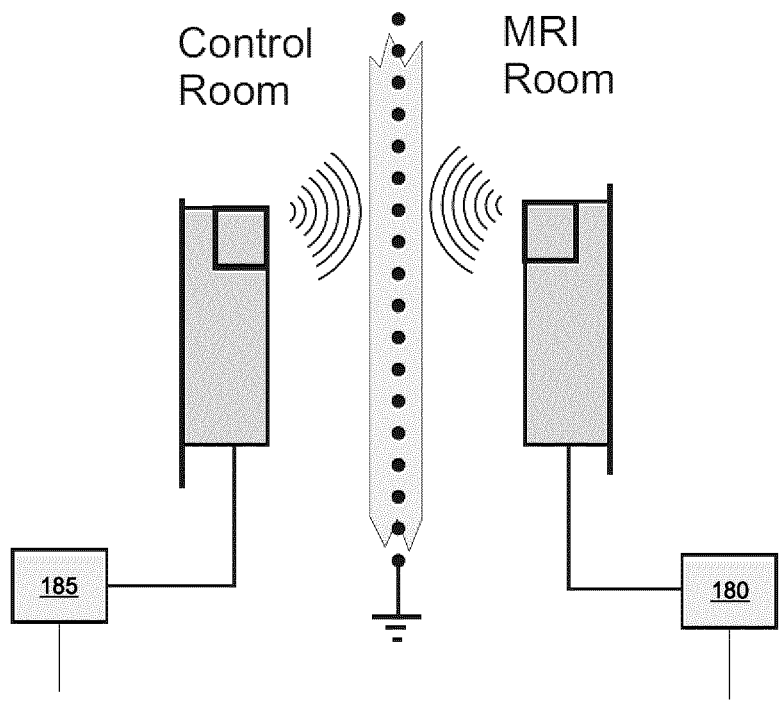
FIG. 6 shows an example wireless communication system in which the wireless bridge communicates with devices through wired connections.

In FIG. 5, an example configuration of a wireless bridge is shown in which the wireless bridge communicates with other devices through wired and/or wireless connections. As illustrated in the figure, the first RF communication device communicates wirelessly with an internal device 180, and the second RF communication device communicates with an external device 185 through a wired connection. An alternative example embodiment is shown in FIG. 6, in which the wireless bridge communicates with internal and external devices 180 and 185 through wired connections. In general, the RF bridge may be configured such that either one of the first RF communication device and the second RF wireless communication device are capable of communicating with devices through wired connections, wireless connections, or a combination of wired and wireless connections.

It will be understood that although many of the figures of the present disclosure show symmetric configurations of the wireless bridge, with the first RF communication device and the second RF communication device having a common configuration of sub-components, these figures are not intended to limit the scope of the present disclosure to such symmetric configurations. In alternative example embodiments, non-symmetric configurations can be obtained by selecting different sub-component configurations for the first and second RF communication devices. For example, an alternative configuration can be obtained by assembling an RF wireless bridge device based on the first RF communication device of FIG. 2 and the second RF communication device of FIG. 3.

Figure 7A:
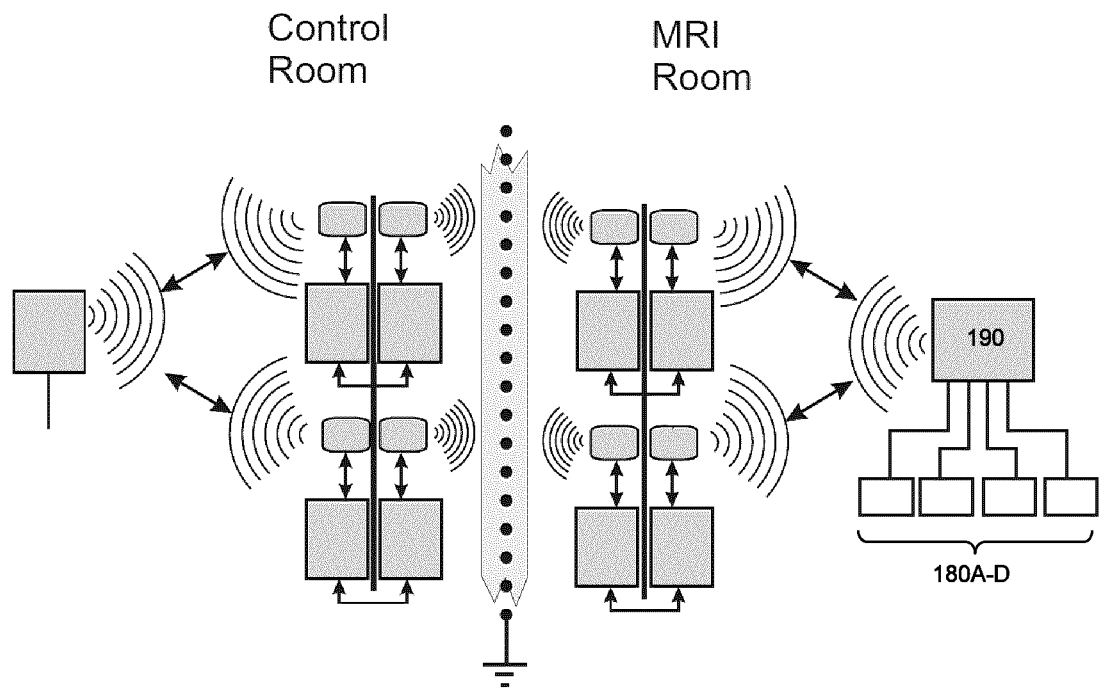
FIGS. 7A and 7B show example wireless communication systems in which two wireless bridges are employed, where the wireless bridges transmit and receive wireless signals through the RF attenuating window in different frequency bands.
Figure 7B:
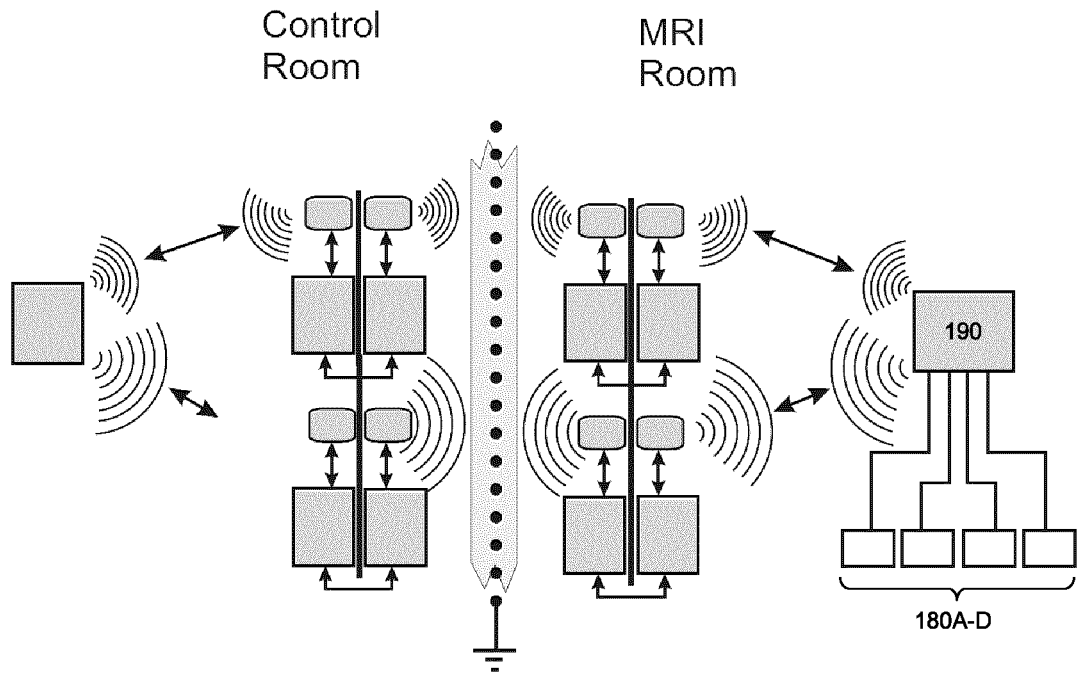

Referring now to FIG. 7A, an example configuration is shown in which two wireless bridges are employed to facilitate communication across the RF attenuating window. Such a configuration may be employed to provide redundancy of signal transmission in order to provide backup transmission channels in the event of the failure of one of the transceivers. Alternatively, the two wireless bridges may be employed to transmit different signals at different frequency bands. For example, as shown in FIG. 7B, the first RF wireless bridge, shown in the upper portion of the figure, may be employed for the transmission of communication signals at first frequency band, and the second RF wireless bridge, shown in the lower portion of the figure, may be employed for the transmission of communication signals at a second frequency band, where the first frequency band is higher in frequency than the second frequency band.

In one example implementation, the first RF wireless bridge may be configured for transmitting communication signals having a higher bandwidth than signals that are transmitted by the second RF wireless bridge, such that the higher bandwidth communication signals experience less RF attenuation by the RF attenuating window as per the frequency-dependent attenuation of the RF attenuating window. Accordingly, in one example implementation, the first RF wireless bridge may be configured for the transmission of video signals, and the second wireless bridge may be configured for the transmission of audio signals. In another example implementation, the first RF wireless bridge may be configured for the transmission of video signals and audio signals, and the second wireless bridge may be configured for the transmission of lower-bandwidth data, such as data associated with one or more physiological sensors.

FIG. 7A also illustrates an example of another type of dual-bridge configuration in which an additional wireless device 190 is located within the scanner room. This additional wireless device 190 is operably connected to one or more internal devices 180A-D through wired connections, and is capable of wireless communication with one or both of the first and second wireless bridges. The additional wireless device 190 effectively forms an additional wireless bridge between the first and/or second wireless bridges, and the wired internal devices 180A-D. Such an additional wireless device may be incorporated into any of the preceding embodiments, or variations thereof, to facilitate connections with wired devices within the scanner room.

Figure 8A:
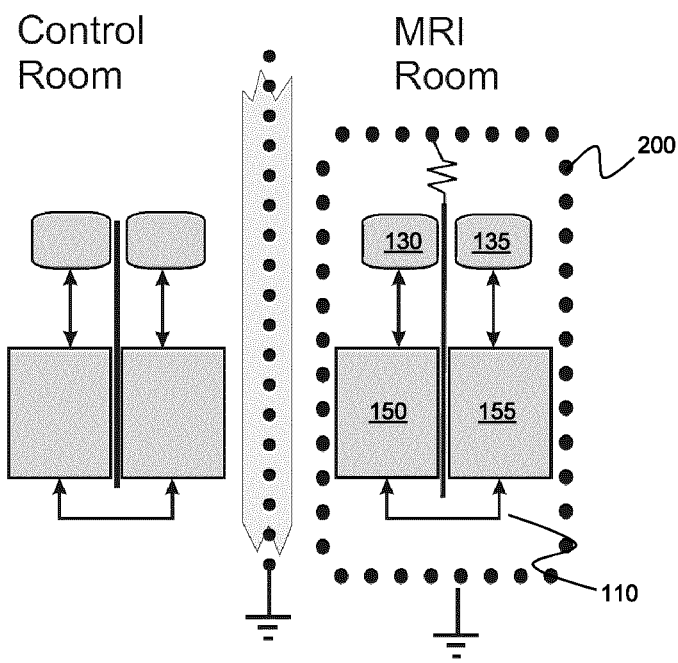
FIG. 8A shows an example wireless bridge in which the first RF communication device, located within the scanner room, includes an electromagnetically shielded enclosure that is transmissive to electromagnetic waves within at least the wireless bridge frequency band, while attenuating electromagnetic waves generated by noise sources within the first transceiver, where the electromagnetically shielded enclosure is grounded.
Figure 8B:
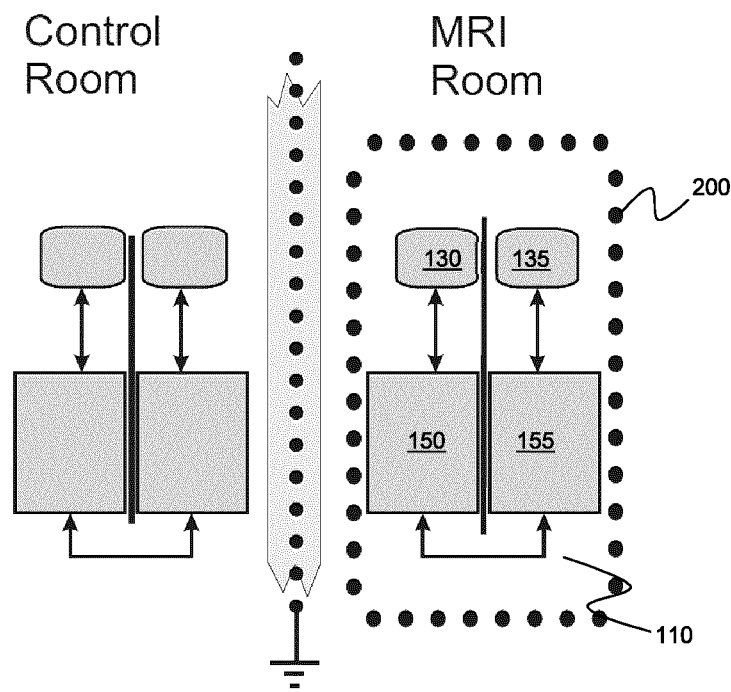
FIG. 8B shows an example wireless bridge in which the first RF communication device, located within the scanner room, includes an electromagnetically shielded enclosure that is transmissive to electromagnetic waves within at least the wireless bridge frequency band, while attenuating electromagnetic waves generated by noise sources within the first transceiver, where the electromagnetically shielded enclosure is not grounded and has a floating potential with respect to any power or ground plane on the communication device.

In some example implementations, the first RF communication device of the RF wireless bridge may contain one or more electronic components that can themselves emit RF noise at the Larmor frequency into the scanner (magnet) room (i.e. within the operational bandwidth of the MR scanner). As shown in FIGS. 8A and 8B, the RF noise emitted by the electrical components may be removed using a secondary electromagnetically shielding enclosure 200 that encloses at least a portion of the first RF communication device 110.

In the example embodiments shown in FIGS. 8A and 8B, the secondary electromagnetically shielding enclosure 200 encloses the first transceiver 150, the first antenna 130, the additional transceiver 155, and the additional antenna 135. In such as case, the secondary electromagnetically shielding enclosure 200 is constructed using a conductive mesh that permits wireless transmission within the wireless bridge frequency band employed by the first transceiver 150 and the first antenna 130 for communication through the RF attenuating window, while electromagnetically shielding RF noise within the operationally bandwidth of the MR scanner. The secondary electromagnetically shielding enclosure 200 also permits wireless transmission within the wireless frequency band employed by the additional transceiver 155 and the additional antenna 135 for communication with internal devices (not shown in the figure).

FIGS. 8A and 8B illustrate two different example implementations in which the secondary electromagnetically shielding enclosure 200 is grounded to the main electromagnetically shielding enclosure of the scanner room (FIG. 8A), or electrically floating relative to the main electromagnetically shielding enclosure of the scanner room (FIG. 8B). Also, as illustrated in FIGS. 8A and 8B, the secondary electromagnetic shielding enclosure 200 can be either connected (FIG. 8A) to the internal RF communication device or left unconnected (FIG. 8B) so that it is electrically floating relative to the communication device.

Figure 9:
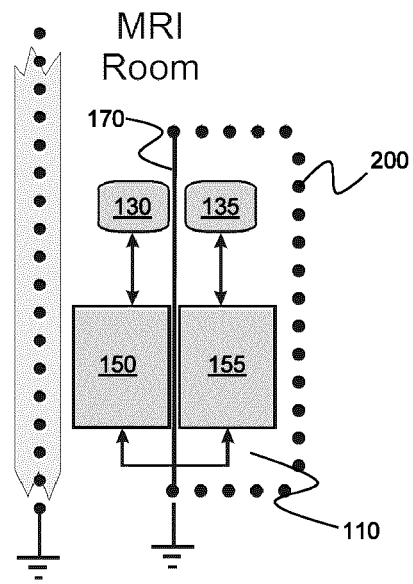
FIG. 9 shows an example wireless bridge in which the first RF communication device, located within the scanner room, includes an additional wireless transceiver and an additional antenna for communicating wirelessly with one or more internal devices located within the scanner room within an additional frequency band that lies above the operational frequency of the magnetic resonance scanner. The first RF communication device also includes an electromagnetically shielded enclosure that encloses the additional wireless transceiver and the additional antenna. The electromagnetically shielded enclosure is transmissive to electromagnetic waves within the additional frequency band, while attenuating electromagnetic waves generated by noise sources within the additional transceiver.

FIG. 9 shows an example wireless bridge in which the secondary electromagnetically shielded enclosure 200 encloses the additional wireless transceiver 155 and the additional antenna 135, without enclosing the first transceiver 150 and the first antenna 130. The secondary electromagnetically shielded enclosure 200 is configured to be transmissive to electromagnetic waves within the frequency band employed by the additional transceiver 155 and the additional antenna 135, while attenuating electromagnetic waves generated by noise sources within the additional transceiver 155. As shown in the figure, a conductive plane of the circuit board 170 may form a portion of the secondary electromagnetically shielded enclosure 200.

Figure 10:
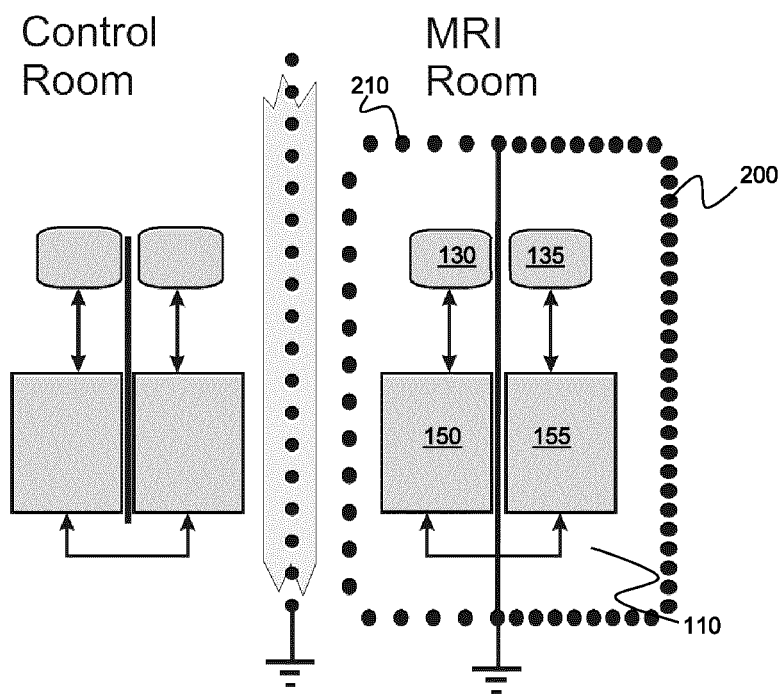
FIG. 10 shows an example wireless bridge in which the first RF communication device, located within the scanner room, includes an additional wireless transceiver and an additional antenna for communicating wirelessly with one or more internal devices located within the scanner room within an additional frequency band that lies above the operational frequency of the magnetic resonance scanner. The first RF communication device also includes a first electromagnetically shielded enclosure that encloses the first wireless transceiver and the first antenna, and a second electromagnetically shielded enclosure that encloses the additional wireless transceiver and the additional antenna. The first electromagnetically shielded enclosure is transmissive to electromagnetic waves within the within the wireless bridge frequency band, while attenuating electromagnetic waves generated by noise sources within the first transceiver.

FIG. 10 shows another example of a wireless bridge in which, in addition to the secondary electromagnetically shielded enclosure 210 shown in FIG. 9, an additional secondary electromagnetically shielded enclosure is provided that encloses the first wireless transceiver 150 and the first antenna 130. The additional secondary electromagnetically shielded enclosure 210 is configured to be transmissive to electromagnetic waves within the wireless bridge frequency band employed by the first transceiver 150 and the first antenna 130, while attenuating electromagnetic waves generated by noise sources within the first transceiver 150. As shown in the figure, a conductive plane of the circuit board 170 may form a portion of the additional secondary electromagnetically shielded enclosure 210. It should be noted that the mesh size can be selected so the shielding enclosure can be transmissive to transceivers that operate at different frequencies.

In some example embodiments, the secondary electromagnetically shielded enclosure need not enclose all components of the first RF communication device. For example, the secondary electromagnetically shielded enclosure may be configured not to enclose one or more antennae of the first RF communication device. FIG. 11 shows an example wireless bridge in which the secondary electromagnetically shielded enclosure 200 encloses the first wireless transceiver 150 and the additional wireless transceiver 155 without enclosing the first antenna 130 and the additional antenna 135. The first transceiver 150 and the additional transceiver 155 are connected, respectively, to the first antenna 130 and the additional antenna 135, through ports 220 and 222. In the present example embodiment, the secondary electromagnetically shielded enclosure 200 need not be transmissive to electromagnetic waves within the frequency band employed by the additional transceiver 155 and the additional antenna 135 or transmissive to electromagnetic waves within the wireless bridge frequency band employed by the first transceiver 150 and the first antenna 130. As shown in the figure, the additional transceiver may be connectable to one or more internal devices via wired connections through one or more ports 224, 226. It is further noted that the ports through the Faraday enclosure can also contain filters to remove noise on the electrical lines.

Many of the preceding example embodiments involve the transmission, within the electromagnetically shielded enclosure, from the first RF communication device 110 of the RF wireless bridge to an internal wireless device 180. However, one of the challenges with the use of high frequency wireless signals is that they can be attenuated heavily by the presence of dielectric bodies. For example, as shown in the configuration illustrated in FIG. 12A, in which the internal wireless device 180 (internal meaning internal to the electromagnetically shielded enclosure 20) is placed inside the bore of the MR scanner 30 above the patient's head, the wireless pathway between the window-mounted first RF communication device 110 of the wireless bridge is at least partially blocked by the body, thereby degrading wireless integrity.

FIGS. 12B-12E illustrate several example embodiments that may be employed to address the aforementioned problem of signal degradation when communicating wirelessly with an internal wireless device located within the bore of the MR scanner 30.

With reference to FIG. 12B, an intermediate wireless bridge 300 may be employed to relay wireless signals from the first RF communication device 110 of the wireless bridge to a wireless device 180 located in the bore of the MR scanner. As shown in the figure, the intermediate wireless bridge 300 may be secured to a wall (as shown), ceiling (not shown) or other surface at a location that facilitates line-of-sight wireless communication with the inner wireless device 180 residing within the bore of the MR scanner 30. In another example embodiment, the intermediate wireless bridge 300 may be located within a prescribed spatial offset from the distal end of the bore of the MR scanner, such as within 0.5, 1 and 2 meters of the distal end of the bore, in order to achieve sufficient signal strength. In some example embodiments, the intermediate wireless bridge 300 may be secured at a location that facilitates line-of-sight wireless communication with the both the first RF communication device and the inner wireless device 180 residing within the bore of the MR scanner 30.

In one example embodiment, the wireless link between the first RF communication device 110 and the intermediate wireless bridge 300, and the wireless link between the intermediate wireless bridge 300 and the in-bore wireless device 180 can be configured to be interdependent wireless pairings. In such a configuration, signals are passed between the first RF communication device 110 and the intermediate wireless bridge and then to the in-bore wireless device 180. The independent wireless links are configured so that they are independent and do not interfere with each other. This may be accomplished, for example, through the selection of a specific wireless channel for each link. Alternatively, each wireless link can employ an appropriate frequency-hoping paradigm as to avoid interference between the wireless links.

In another example embodiment, the intermediate wireless bridge 300 can be configured as a repeater such that wireless signals emitted from the first RF communication device 110 are repeated by the intermediate wireless bridge to extend the range of the wireless link.

FIG. 12C illustrates another example embodiment in which two room-mounted intermediate wireless bridges are illustrated. The bridges are affixed to surfaces within the room (e.g. walls or the ceiling) such that one intermediate wireless bridge has a clear line of sight with the in-bore wireless device 180 during foot-first applications (when the wireless device 180 is located near the proximal end of the bore) and the other intermediate wireless bridge has a clear line of sight with the in-bore wireless device during head-first applications (when the wireless device 180 is located near the proximal end of the bore). Depending on the patient position either bridge can be selected to provide a wireless pathway to from the window-mounted bridge to the in-bore wireless receiver.

In example embodiments in which multiple intermediate bridges are present, such as FIG. 12C (and FIG. 12E that is discussed below), one of the intermediate wireless bridges may be selected for use. For example, the wireless pathway and intermediate wireless bridge selection can be performed automatically by processing signals received by each intermediate wireless bridge (optionally interleaving the operation of the two intermediate wireless bridges) and selecting the intermediate bridge that is able to maintain a higher signal integrity for signals received by the in-bore wireless device 180. This processing can be performed, for example, by control circuitry 30 that is employed to control the MR scanner, or via separate control circuitry (having at least a computer processor and a memory). For example, the signal strength between the in-bore wireless receiver and each intermediate bridge can be reported to a control unit that selects the appropriate intermediate bridge to use. Alternatively, a manual selection can be performed by a technologist, such as using a control unit inside or outside of the MR room, using switches located on one or more of the intermediate wireless transceivers, and using a user interface on a mobile display device.

With reference to FIG. 12D, a movable intermediate wireless bridge 310 is shown to relay wireless signals from the window-mounted bridge unit to a wireless device 180 located in the bore of the MR scanner. The movable intermediate wireless bridge 310 is beneficial in that it can be moved to a location where the body is not blocking the wireless pathway. For example, during head-first imaging applications (shown), the movable intermediate wireless bridge 310 can be moved to the back of the MRI (adjacent or proximal to the distal end of the MR bore). During foot-first, imaging applications, the movable intermediate wireless bridge 310 can be moved to the front of the MRI. Moreover, the m With reference to FIG. 12E, an alternative example embodiment is illustrated in which two movable intermediate wireless bridges 310 and 315 are illustrated. Each movable intermediate wireless bridge can be moved to and parked in a location that provides a clear line of sight between the movable intermediate wireless bridge and the in-bore wireless device during either head-first of foot-first applications.

It will be understood that the example embodiments shown in FIGS. 12B-12E may be combined in a given example implementation, such as combining example embodiments with both fixed and movable additional wireless bridges.

It will be understood that although the preceding example embodiments, while disclosed within the context of magnetic resonance scanner systems, may be applied, extended or adapted to other electromagnetically shielding applications and environments that do not involve magnetic resonance scanning. Examples of such applications that may employ an electromagnetically shielding enclosure having an RF attenuating window include applications involving the manufacturing of sensitive electronic devices and components; applications involving testing, calibration and/or metrology; and applications involving secrecy, such as commercial or defense laboratories or test facilities. The example embodiments disclosed above may be adapted for use in such applications, particularly in cases in which the RF attenuating window is attenuating, yet partially transparent, to electromagnetic waves within a frequency range that is beyond a desired shielding frequency range of the electromagnetically shielding enclosure.

While many of the preceding example embodiments describe wireless bridge systems and devices that facilitate the intermediate transmission of RF waves through an RF attenuating window forming a portion of an electromagnetically shielding enclosure, it will be understood that an RF attenuating window is but one example of an RF attenuating region, which is defined herein as a region of an electromagnetically shielding enclosure that is attenuating, yet partially transmissive, to electromagnetic waves within a frequency range that lies beyond a desired shielding frequency range of the electromagnetically shielding enclosure (e.g. within a frequency range above an operational bandwidth of a magnetic resonance scanner). Accordingly, in various additional example embodiments, the wireless bridge example embodiments described above may be adapted to facilitate wireless transmission through other types of RF attenuating regions.

For example, some electromagnetically shielded enclosures are constructed with door frames that include conductive fingers designed to make electrical contact with the door when the door closes in order to achieve electromagnetic shielding within the gap between the door and the door frame. A photograph of an example door frame equipped with such conductive fingers is shown in FIG. 13A and in the corresponding drawing shown in FIG. 13B. The door 400 contains of a continuous plane of conductive material and is designed such that when closed, the door's conductor makes electrical contact with conductive fingers 420 on the door frame 430 in order to maintain the shielding around the electromagnetically shielding enclosure (Faraday cage). The detail in FIG. 13B shows individual electrically conductive fingers 432 and 434.

The electrically conductive fingers 420 provide non-continuous electrical conduction and gaps are present between the fingers. Such an RF attenuating region is similar to the electrically conductive mesh in an RF attenuating window, as the electrically conductive fingers can be spaced to strongly attenuate electromagnetic waves within a desired shielding frequency range of the electromagnetically shielding enclosure (e.g. the operational bandwidth of a magnetic resonance imaging scanner). As in the case of an RF attenuating window, the electrically conductive fingers attenuate RF energy at frequencies about the desired shielding range of the enclosure, but with less attenuation than within the desired shielding range. As an example, a door frame with conductive fingers with a given spacing will have similar frequency-dependent attenuation properties compared to an RF attenuating window that includes an electrically conductive mesh with an equivalent conductor spacing.

FIGS. 13C-13E illustrate an example of the placement of a wireless bridge to facilitate RF transmission across such a structure (the figure does not show the electrically conductive fingers). The first RF communication device 110 and second RF communication device 120 of the wireless bridge are mounted on opposite sides of the door frame 440 and maintain wireless communication through the gaps in the electrically conductive fingers. FIGS. 13D and 13E show a top view with the door 400 in a closed and open configuration, respectively. In the present example embodiment, the wireless bridge is mounted on the side of the door 400 that is opposite to the hinged side. Although the RF communication devices are shown contacting either side of the door frame 440, it will be understood that the RF communication devices may be spaced further apart (e.g. with a gap on one or both sides of the door frame 440), provided that the first RF communication device 110 and the second RF communication device 120 are positioned with sufficient proximity to each other such that the wireless bridge facilitates indirect communication through the RF attenuating region (the electrically conductive fingers, in the present example) despite attenuation of RF energy by the RF attenuating region. Any of the preceding wireless bridge embodiments, or variations thereof, may be employed or adapted to facilitate indirect RF wireless transmission across such an RF attenuating region.

Referring now to FIGS. 13F and 13G illustrate an alternative example embodiment in which the first and second RF communication devices 110, 120 are mounted on the hinge side of the door 400. It will be understood that the embodiments shown in FIGS. 13C-13E and in FIGS. 13F-13G illustrate two non-limiting example configurations of the wireless bridge, and that many other configurations may be employed, provided that the wireless bridge facilitates indirect communication through the RF attenuating region despite attenuation of RF energy by the RF attenuating region.

The RF attenuating windows and door frames disclosed above provide non-limiting examples RF attenuating regions than can be employed to facilitating indirect RF wireless transmission using a wireless bridge. However, it will be understood that many other types of RF attenuating regions, such as other areas of the electromagnetically shielding enclosure where a solid conductor has been broken for practical or functional reasons, may be employed to facilitate wireless transmission, such as, but not limited to, regions around ventilation ducts, regions around cables, regions around optical cables, regions around a penetration panel, regions around exhaust ventilation, regions around waveguides, and regions around power outlets.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A magnetic resonant imaging and communication system comprising:
    a magnetic resonance scanner having an operating frequency range;
    an electromagnetically shielded enclosure defining a scanner room, the scanner room containing said magnetic resonance scanner;
    said electromagnetically shielded enclosure comprising an RF attenuating window having an internal window surface facing inside the scanner room and an external window surface facing outside the scanner room; and
    a wireless bridge for relaying wireless signals across said RF attenuating window, said wireless bridge comprising:
        a first RF communication device located inside the scanner room, said first RF communication device comprising a first transceiver operably connected to a first antenna; and
        a second RF communication device located outside the scanner room, said second RF communication device comprising a second transceiver operably connected to a second antenna;
    wherein said first RF communication device and said second RF communication device are configured for wireless transmission of communication signals therebetween through said RF attenuating window within a wireless bridge frequency band that lies above the operating frequency range of said magnetic resonance scanner;
    wherein said first RF communication device is further configured to transmit communication signals to and receive communication signals from one or more internal devices located within the scanner room, and wherein said second RF communication device is further configured to transmit communication signals to and receive communication signals from one or more external devices located outside of the scanner room; and
    wherein said first RF communication device and said second RF communication device are positioned with sufficient proximity to each other such that said wireless bridge facilitates indirect communication through said RF attenuating window despite attenuation of RF energy by said RF attenuating window.

2. The magnetic resonant imaging and communication system according to claim 1 wherein least one of said first RF communication device and said second RF communication device is positioned such that the antenna associated therewith resides within 50 cm of a respective window surface.

3. The magnetic resonant imaging and communication system according to claim 1 wherein least one of said first RF communication device and said second RF communication device is positioned such that an antenna associated therewith resides within 25 cm of a respective window surface.

4. The magnetic resonant imaging and communication system according to claim 1 wherein said first RF communication device and said second RF communication device are positioned relative to said RF attenuating window such that the respective antennas of said first RF communication device and said second RF communication device that are employed for wireless transmission within the wireless bridge frequency band are spatially separated by less than 100 cm.

5. The magnetic resonant imaging and communication system according to claim 1 wherein said first RF communication device and said second RF communication device are positioned relative to said RF attenuating window such that the respective antennas of said first RF communication device and said second RF communication device that are employed for wireless transmission within the wireless bridge frequency band are spatially separated by less than 50 cm.

6. The magnetic resonant imaging and communication system according to claim 1 wherein one or both of said first RF communication device and said second RF communication device are mounted to said RF attenuating window.

7. The magnetic resonant imaging and communication system according to claim 1 wherein one or both of said first RF communication device and said second RF communication device are supported adjacent to said RF attenuating window without contacting said RF attenuating window.

8. The magnetic resonant imaging and communication system according to claim 1 wherein at least one of said first antenna and said second antenna is a directional antenna with a maximum directivity in the direction of said RF attenuating window.

9. The magnetic resonant imaging and communication system according to claim 1 wherein said first transceiver is connectable to at least one internal device through a wired connection.

10. The magnetic resonant imaging and communication system according to claim 1 wherein said first antenna is integrated with said first transceiver.

11. The magnetic resonant imaging and communication system according to claim 1 wherein said electromagnetically shielded enclosure defining the scanner room is a first electromagnetically shielded enclosure, and wherein said first RF communication device comprises a second electromagnetically shielded enclosure enclosing said first transceiver, and wherein said second electromagnetically shielded enclosure is configured to attenuating electromagnetic waves generated by noise sources within said first transceiver.

12. The magnetic resonant imaging and communication system according to claim 11 wherein said first transceiver is connected to said first antenna through a conduit provided in said second electromagnetically shielded enclosure.

13. The magnetic resonant imaging and communication system according to claim 11 wherein said second electromagnetically shielded enclosure is grounded.

14. The magnetic resonant imaging and communication system according to claim 11 wherein said second electromagnetically shielded enclosure encloses said first antenna, and wherein said second electromagnetically shielded enclosure is configured to be transmissive to electromagnetic waves within the wireless bridge frequency band.

15. The magnetic resonant imaging and communication system according to claim 1 wherein said first RF communication device comprises a circuit board operatively connected to said first transceiver and said first antenna;
wherein said first transceiver is supported on a side of said circuit board that faces away from said internal window surface.

16. The magnetic resonant imaging and communication system according to claim 1 wherein said second RF communication device comprises a circuit board operatively connected to said second transceiver and said second antenna;
wherein said second transceiver is supported on a side of said circuit board that faces away from said external window surface.

17. The magnetic resonant imaging and communication system according to claim 1 wherein said first RF communication device is configured to transmit wireless signals to, and receive wireless signals from, at least one internal device within a first frequency band that lies outside of the operating frequency range of said magnetic resonance scanner.

18. The magnetic resonant imaging and communication system according to claim 17 wherein said first RF communication device comprises an additional antenna for wirelessly communicating with at least one of the one or more internal devices within the first frequency band.

19. The magnetic resonant imaging and communication system according to claim 18 wherein said first RF communication device comprises a circuit board operatively connected to said first transceiver, said first antenna, and said additional antenna;
wherein said first antenna is supported on a first side of said circuit board that faces toward said internal window surface; and
wherein said additional antenna is supported on a second side of said circuit board that faces away from said internal window surface.

20. The magnetic resonant imaging and communication system according to claim 18 wherein said additional antenna is operably connected to said first transceiver.

21. The magnetic resonant imaging and communication system according to claim 18 wherein said first RF communication device comprises an additional transceiver, wherein said additional transceiver is operably connected to said first transceiver and said additional antenna, for transmitting and receiving wireless signals within the first frequency band.

22. The magnetic resonant imaging and communication system according to claim 21 wherein said first RF communication device comprises a circuit board operatively connected to said first transceiver, said additional transceiver, said first antenna, and said additional antenna;
wherein said first transceiver is supported on a first side of said circuit board that faces toward said internal window surface; and
wherein said additional transceiver is supported on a second side of said circuit board that faces away from said internal window surface.

23. The magnetic resonant imaging and communication system according to claim 22 wherein said electromagnetically shielded enclosure defining the scanner room is a first electromagnetically shielded enclosure, and wherein said first RF communication device comprises a second electromagnetically shielded enclosure enclosing said additional transceiver and said additional antenna, and wherein said second electromagnetically shielded enclosure is configured to be transmissive to electromagnetic waves the first frequency band, while attenuating electromagnetic waves generated by noise sources within said additional transceiver.

24. The magnetic resonant imaging and communication system according to claim 23 wherein said first RF communication device further comprises a third electromagnetically shielded enclosure enclosing said first transceiver and said first antenna, and wherein said third electromagnetically shielded enclosure is configured to be transmissive to electromagnetic waves within the wireless bridge frequency band, while attenuating electromagnetic waves generated by noise sources within said first transceiver.

25. The magnetic resonant imaging and communication system according to claim 1 wherein said second RF communication device is configured to transmit wireless signals to, and receive wireless signals from, at least one external device.

26. The magnetic resonant imaging and communication system according to claim 1 wherein said wireless bridge is a first wireless bridge and the wireless bridge frequency band is a first wireless bridge frequency band, said magnetic resonant imaging and communication system further comprising a second wireless bridge configured to employ a second wireless bridge frequency band that lies above the operating frequency range of said magnetic resonance scanner, and also lies above the first wireless bridge frequency band, and wherein a bandwidth of said second wireless bridge exceeds a bandwidth of said first wireless bridge.

27. The magnetic resonant imaging and communication system according to claim 26 wherein the second wireless bridge frequency band is employed for transmission of video signals.

28. The magnetic resonant imaging and communication system according to claim 1 further comprising:
an internal wireless device positioned within a bore of said magnetic resonance scanner; and
an intermediate wireless bridge capable of transmitting wireless signals between said first RF communication device and said internal wireless device.

29. The magnetic resonant imaging and communication system according to claim 28 wherein said intermediate wireless bridge is positioned such that a line of sight is established between said intermediate wireless bridge and said internal wireless device.

30. The magnetic resonant imaging and communication system according to claim 28 wherein said intermediate wireless bridge is movable.

31. The magnetic resonant imaging and communication system according to claim 28 wherein said intermediate wireless bridge is a first intermediate wireless bridge, the system further comprising a second intermediate wireless bridge, wherein said first intermediate wireless bridge is positioned on a first side of the bore of said magnetic resonance scanner, and wherein said second intermediate wireless bridge is positioned on a second side of the bore of said magnetic resonance scanner.

32. The magnetic resonant imaging and communication system according to claim 31 wherein said system is configured such that one of said first intermediate wireless bridge and said second intermediate wireless bridge is selectable, such that the selected intermediate wireless bridge is employed for facilitating wireless signal transmission between said first RF communication device and said internal wireless device, and the unselected intermediate wireless bridge is not employed for facilitating wireless signal transmission between said first RF communication device.

33. The magnetic resonant imaging and communication system according to claim 32 wherein the intermediate wireless bridge employed for facilitating wireless signal transmission between said first RF communication device is manually selectable.

34. The magnetic resonant imaging and communication system according to claim 32 wherein the intermediate wireless bridge is employed for facilitating wireless signal transmission between said first RF communication device is automatically selectable.

35. The magnetic resonant imaging and communication system according to claim 34 further comprising control circuitry for comparing a first signal strength associated with transmission of wireless signals from said first RF communication device to said internal wireless device through said first intermediate wireless bridge to a second signal strength associated with transmission of wireless signals from said first RF communication device to said internal wireless device through said second intermediate wireless bridge, and selecting the intermediate wireless bridge having the highest associated signal strength.

36. The magnetic resonant imaging and communication system according to claim 31 wherein said second intermediate wireless bridge is movable.

37. A wireless communication system for communication through an RF attenuating window of a scanner room of a magnetic resonance scanning system, the wireless communication system comprising:
a first RF communication device comprising a first transceiver operably connected to a first antenna;
a second RF communication device comprising a second transceiver operably connected to a second antenna;
wherein said first RF communication device and said second RF communication device are configured for wireless transmission within a wireless bridge frequency band that lies above 2 GHz, such that said first RF communication device and said second RF communication device form a wireless bridge when positioned on opposing sides of the RF attenuating window of an electromagnetically shielded enclosure that encloses the scanner room of a magnetic resonance scanner;
wherein said first RF communication device and said second RF communication device are configured such that when said first RF communication device and said second RF communication device are positioned with sufficient proximity to each other, on either side of the RF attenuating window, said first RF communication device transmits communication signals to and receives communication signals from one or more internal devices located within the scanner room, and said second RF communication device transmits communication signals to and receives communication signals from one or more external devices located outside of the scanner room, said wireless bridge facilitates indirect communication through the RF attenuating window despite attenuation of RF energy by the RF attenuating window.

38. A magnetic resonant imaging and communication system comprising:
a magnetic resonance scanner having an operating frequency range;
an electromagnetically shielded enclosure defining a scanner room, the scanner room containing said magnetic resonance scanner;
said electromagnetically shielded enclosure comprising an RF attenuating region that is attenuating, yet partially transmissive, to electromagnetic waves within an operational bandwidth of the magnetic resonance scanner; and
a wireless bridge for relaying wireless signals across said RF attenuating region, said wireless bridge comprising:
a first RF communication device located inside the scanner room, said first RF communication device comprising a first transceiver operably connected to a first antenna; and
a second RF communication device located outside the scanner room, said second RF communication device comprising a second transceiver operably connected to a second antenna;
wherein said first RF communication device and said second RF communication device are configured for wireless transmission of communication signals therebetween through said RF attenuating region within a wireless bridge frequency band that lies above the operating frequency range of said magnetic resonance scanner;
wherein said first RF communication device is further configured to transmit communication signals to and receive communication signals from one or more internal devices located within the scanner room, and wherein said second RF communication device is further configured to transmit communication signals to and receive communication signals from one or more external devices located outside of the scanner room; and
wherein said first RF communication device and said second RF communication device are positioned with sufficient proximity to each other such that said wireless bridge facilitates indirect communication through said RF attenuating region despite attenuation of RF energy by said RF attenuating region.

39. The magnetic resonant imaging and communication system according to claim 38 wherein said RF attenuating region is associated with electrically conductive fingers of a door frame.

40. The magnetic resonant imaging and communication system according to claim 38 wherein said RF attenuating region is selected from the group consisting of regions around ventilation ducts, regions around cables, regions around optical cables, regions around a penetration panel, regions around exhaust ventilation, regions around waveguides, and regions around power outlets.

\* \* \* \* \*